US012757393B2

(12) United States Patent
Hopkins et al.

(10) Patent No.: US 12,757,393 B2
(45) Date of Patent: Oct. 6, 2026

(54) MEMORY ARRAY AND METHOD USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 629 days.

(21) Appl. No.: 18/133,075

(22) Filed: Apr. 11, 2023

(65) Prior Publication Data

US 2023/0247828 A1 Aug. 3, 2023

Related U.S. Application Data

(62) Division of application No. 17/091,420, filed on Nov. 6, 2020, now Pat. No. 11,659,708.

(51) Int. Cl.

| | |
|---|---|
| ***H10B 43/27*** | (2023.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |

(52) U.S. Cl.
CPC ............. *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 11,282,847 | B2 | 3/2022 | Hopkins et al. |
| 2015/0333143 | A1 | 11/2015 | Meldrim et al. |
| 2016/0268263 | A1 | 9/2016 | Lee et al. |
| 2017/0148800 | A1 | 5/2017 | Nishikawa et al. |
| 2017/0179026 | A1 | 6/2017 | Toyama et al. |

(Continued)

FOREIGN PATENT DOCUMENTS

| | | |
|---|---|---|
| CN | 110785851 | 2/2020 |

*Primary Examiner* — Christopher A Johnson
(74) *Attorney, Agent, or Firm* — Wells St. John P.S.

(57) ABSTRACT

A memory array comprises a conductor tier comprising upper conductor material directly above and directly electrically coupled to lower conductor material. The upper and lower conductor materials comprise different compositions relative one another. Laterally-spaced memory blocks individually comprising a vertical stack comprise alternating insulative tiers and conductive tiers. Channel-material strings of memory cells extend through the insulative tiers and the conductive tiers and through the upper conductor material into the lower conductor material. The channel material of the channel-material strings is directly electrically coupled to the upper and lower conductor materials of the conductor tier. Intervening material is laterally-between and longitudinally-along immediately-laterally-adjacent of the memory blocks. Other embodiments, including method, are disclosed.

13 Claims, 14 Drawing Sheets

(56) References Cited

U.S. PATENT DOCUMENTS

| | | | | |
|---|---|---|---|---|
| 2019/0043830 | A1* | 2/2019 | Sakakibara | H10D 1/043 |
| 2019/0371800 | A1 | 12/2019 | Nishikawa et al. | |
| 2020/0266203 | A1 | 8/2020 | Bhushan et al. | |
| 2022/0130791 | A1* | 4/2022 | Lee | H10W 90/00 |

* cited by examiner

MEMORY ARRAY AND METHOD USED IN FORMING A MEMORY ARRAY COMPRISING STRINGS OF MEMORY CELLS

RELATED PATENT DATA

This patent resulted from a divisional application of U.S. patent application Ser. No. 17/091,420, filed Nov. 6, 2020, entitled "Memory Array And Method Used In Forming A Memory Array Comprising Strings Of Memory Cells", naming John D. Hopkins and Nancy M. Lomeli as inventors, the disclosure of which is incorporated by reference.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there—from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array comprising strings of memory cells, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass existing or future-developed integrated circuitry comprising a memory array comprising strings of memory cells independent of method of manufacture, for example comprising NAND architecture. First example method embodiments are described with reference to FIGS. 1-22 which may be considered as a "gate-last" or "replacement-gate", and starting with FIGS. 1 and 2.

Figure 1:
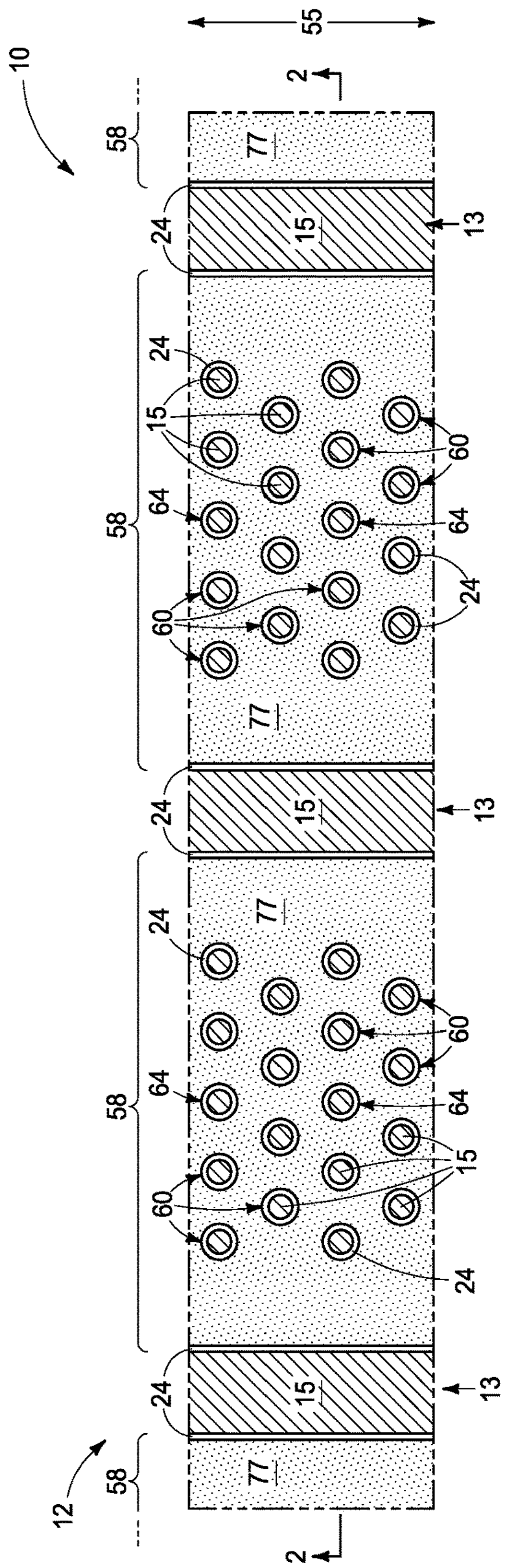
FIG. 1 is a diagrammatic cross-sectional view of a portion of a substrate in process in accordance with an embodiment of the invention and is taken through line 1-1 in FIG. 2.
Figure 2:
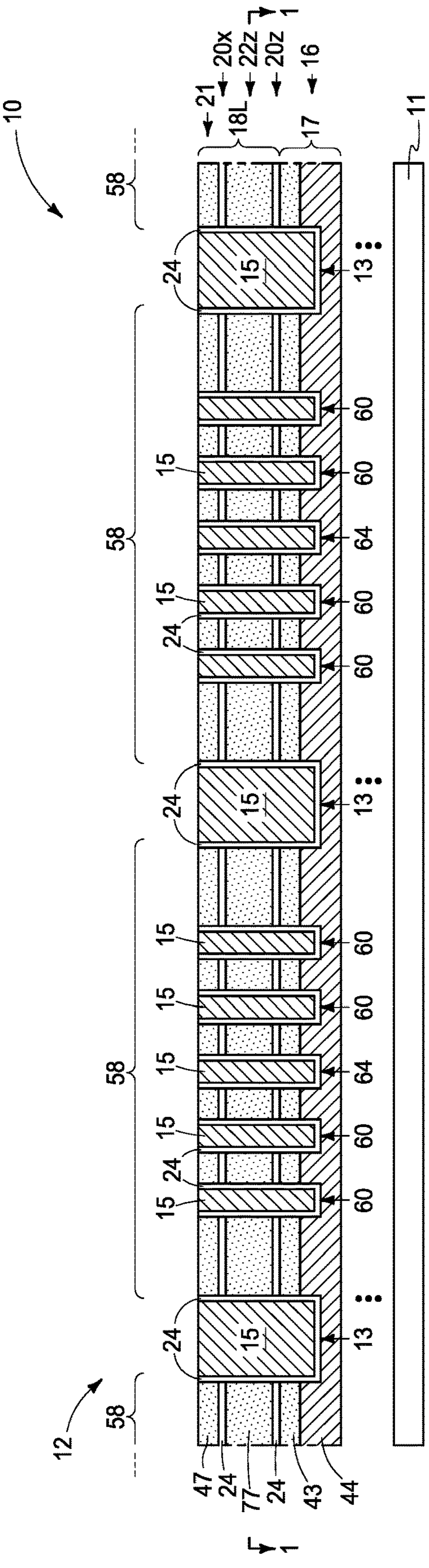
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

In one embodiment, a lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20*z* of second tiers 20* directly above (e.g., directly against) conductor material 17. Lowest second tier 20*z* is insulative (e.g., comprising a material 24 comprising silicon dioxide) and may be sacrificial. A lowest 22*z* of first tiers 22* is directly above (e.g., directly against) lowest second tier 20*z*. Lowest first tier 22*z* comprises sacrificial material 77 (e.g., silicon nitride or polysilicon). In one embodiment, a next-lowest tier 20*x* of second tiers 20* is directly above lowest first tier 22*z* (e.g., comprising material 24). In one embodiment, a conducting tier 21 comprising conducting material 47 (e.g., conductively-doped polysilicon) is directly above next-lowest second tier 20*x*

In one embodiment, sacrificial pillars 60 have been formed in conductor tier 16 and in one such embodiment in material there-above. Sacrificial pillars 60 are horizontally-located (i.e., in x, y coordinates) where individual channel-material strings will be formed. In one embodiment, dummy pillars (not yet shown) will be formed to extend through first tiers 20* and second tiers 22* and through upper conductor material 43 into lower conductor material 44. In this document, a "dummy pillar" is a pillar that does not function as a string of memory cells. In one such embodiment, sacrificial pillars 64 have been formed in conductor tier 16 and in one such embodiment in material there-above. Sacrificial pillars 64 are horizontally-located (i.e., in x, y coordinates) where the individual dummy pillars will be formed. By way of example and for brevity only, sacrificial pillars 60 and 64 are shown as being arranged in groups or columns of staggered rows of four and five pillars 60/64 per row. In one embodiment, sacrificial pillars 60/64 comprise material 24 (e.g., silicon dioxide) and material 15 (e.g., polysilicon, or a thin TiN lining having elemental tungsten radially inward thereof). Pillars 60/64 may taper radially-inward (not shown) moving deeper into lower stack portion 18L. In one embodiment, sacrificial horizontally-elongated lines 13 have been formed in conductor tier 16, and in one such embodiment in material there-above. Sacrificial lines 13 are individually between immediately-laterally-adjacent memory-block regions 58. Example sacrificial lines 13 comprise materials 24 and 15. Sacrificial lines 13 may taper laterally-inward (not shown) moving deeper into lower stack portion 18L. In embodiments where pillars 60, pillars 64, and/or lines 13 are formed, such may be formed at the same time or at two or more different times.

Figure 3:
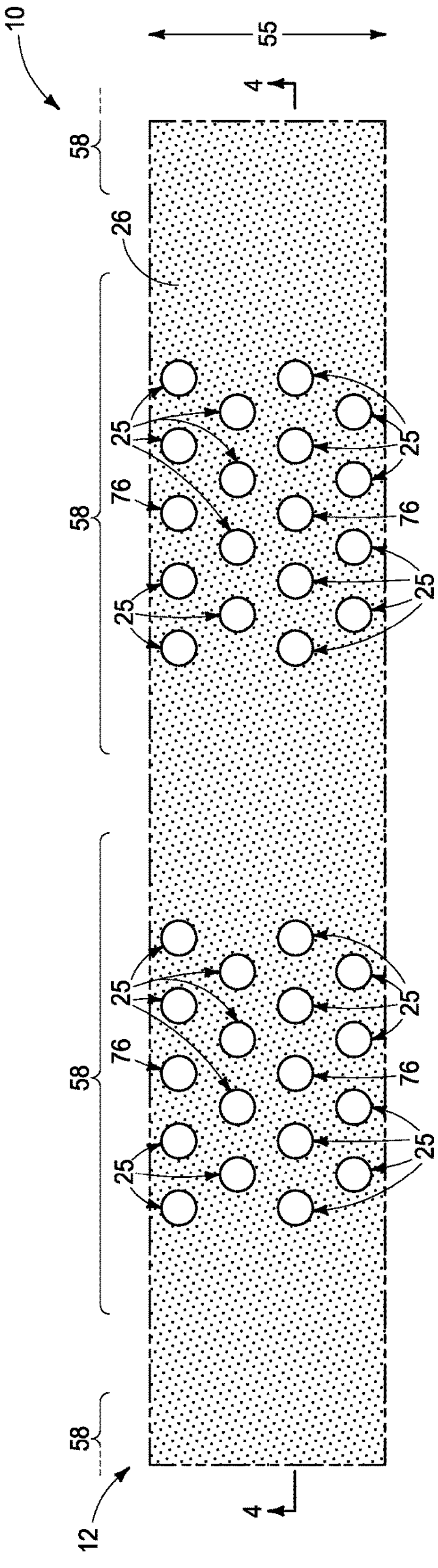
FIGS. 3-23 are diagrammatic sequential sectional, expanded, enlarged, and/or partial views of the construction of FIGS. 1 and 2, or portions thereof, or alternate embodiments, in process in accordance with some embodiments of the invention.
Figure 4:
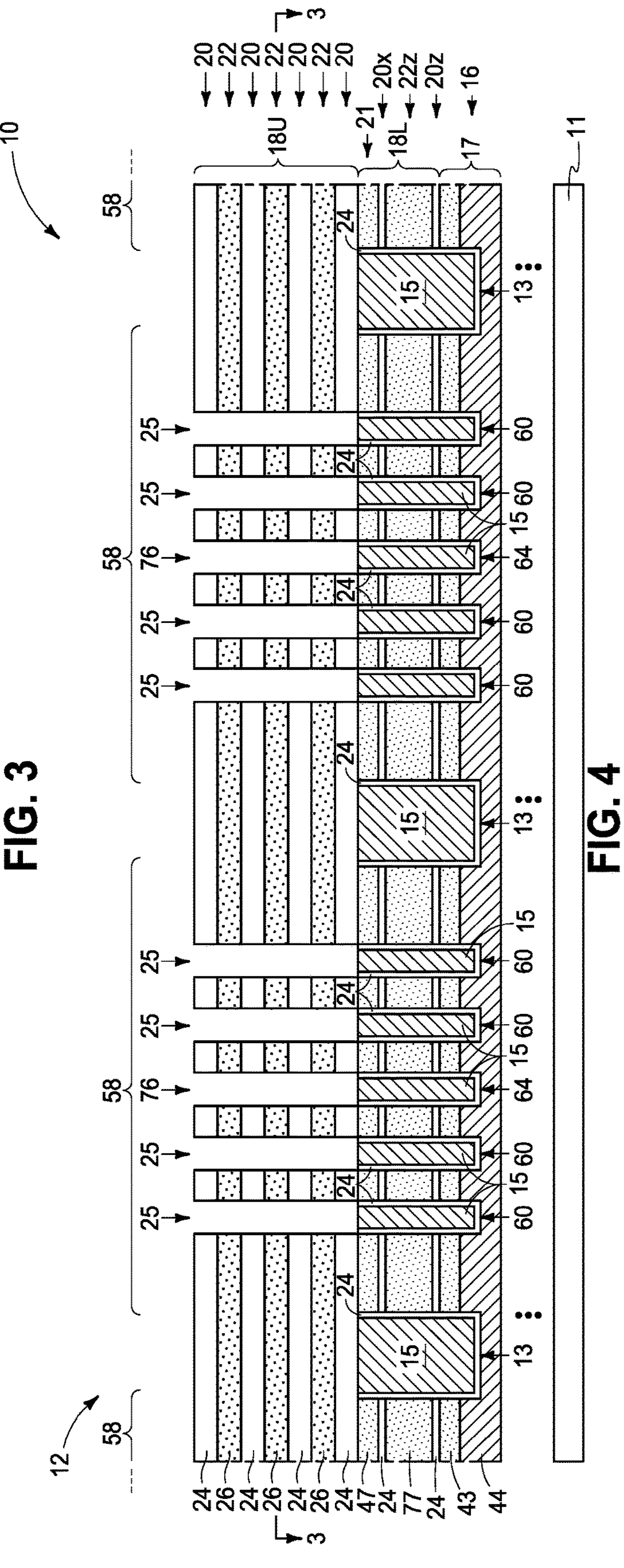

Referring to FIGS. 3 and 4, vertically-alternating first tiers 22 and second tiers 20 of an upper portion 18U of stack 18* have been formed above lower portion 18L. First tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 and dummy openings 76 have been formed (e.g., by etching) through second tiers 20 and first tiers 22 in upper portion 18U to sacrificial pillars 60 and 64, respectively. In this document, a "dummy opening" is an opening in which a dummy pillar has been or will be formed. Openings 25/76 may taper radially-inward moving deeper in stack 18 (not shown).

Figure 5:
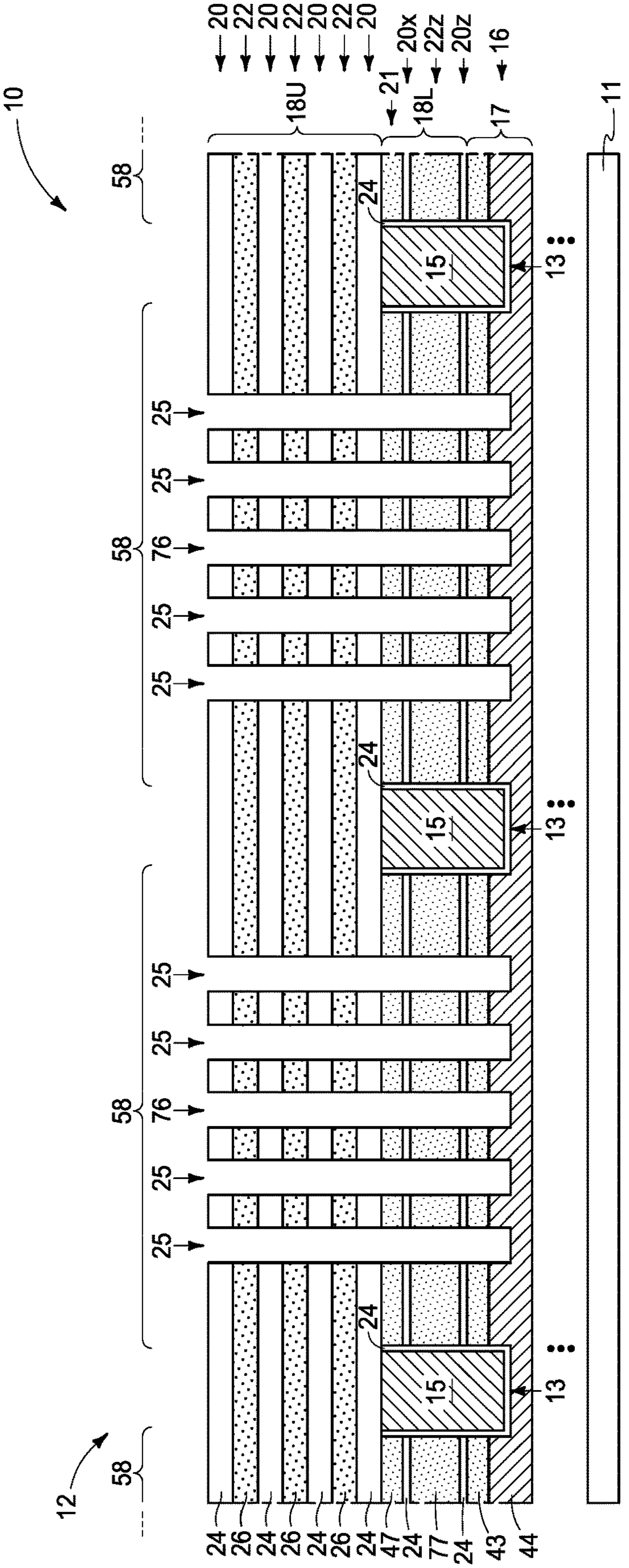
Figure 6:
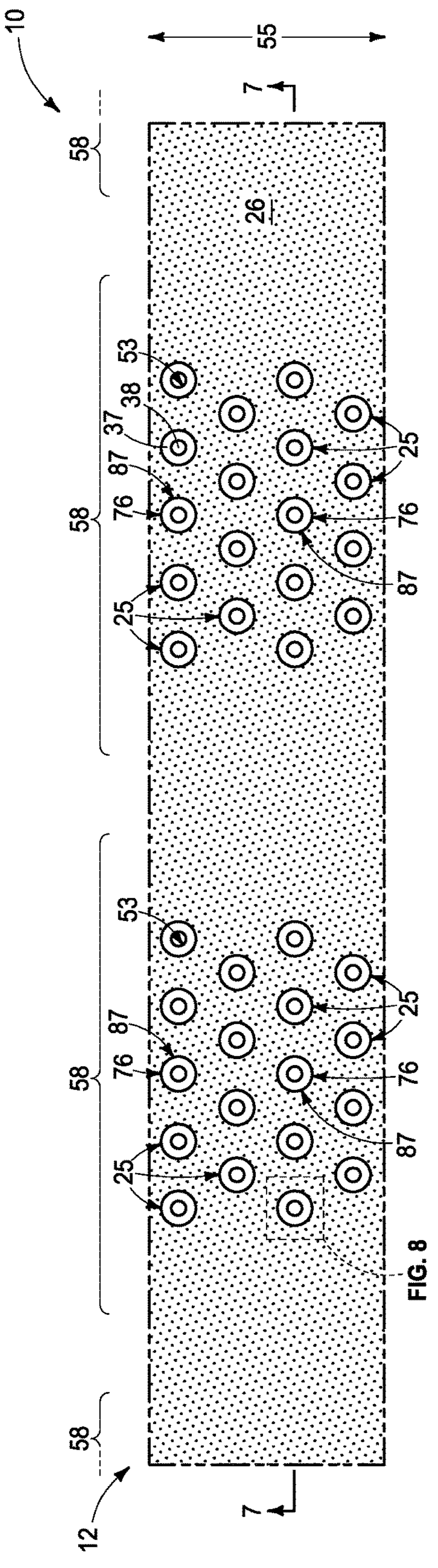
Figure 7:
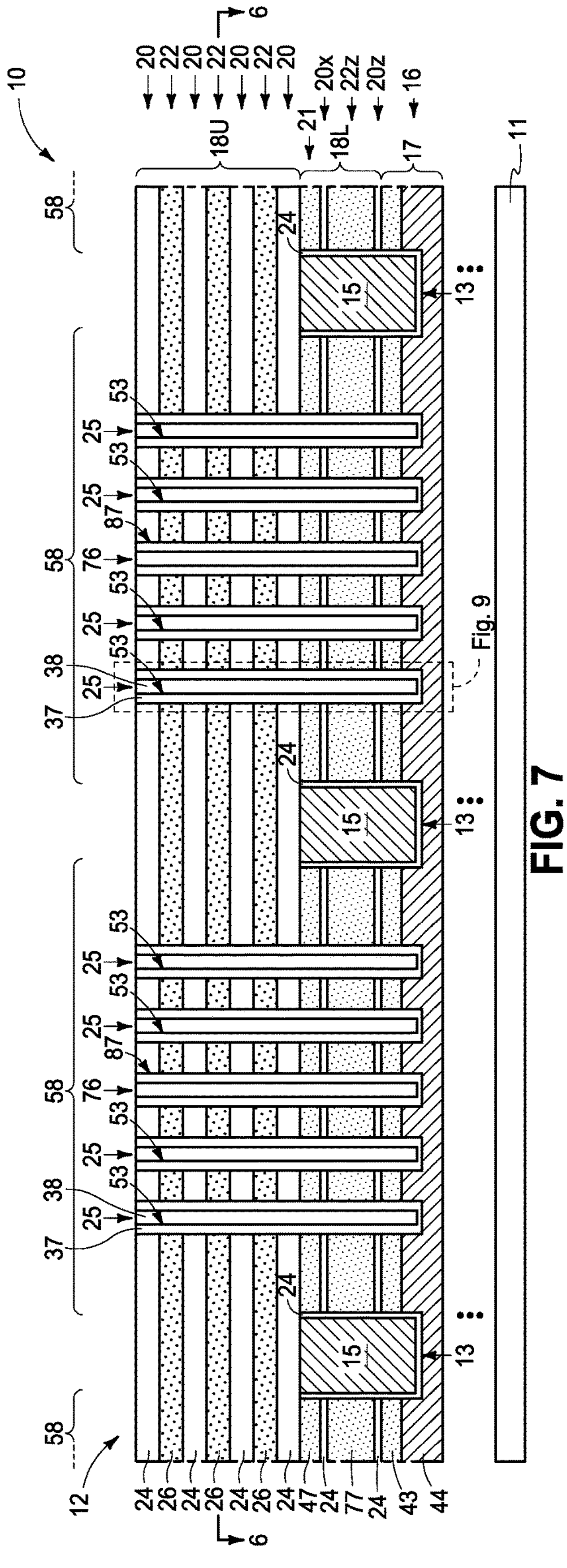
Figure 9:
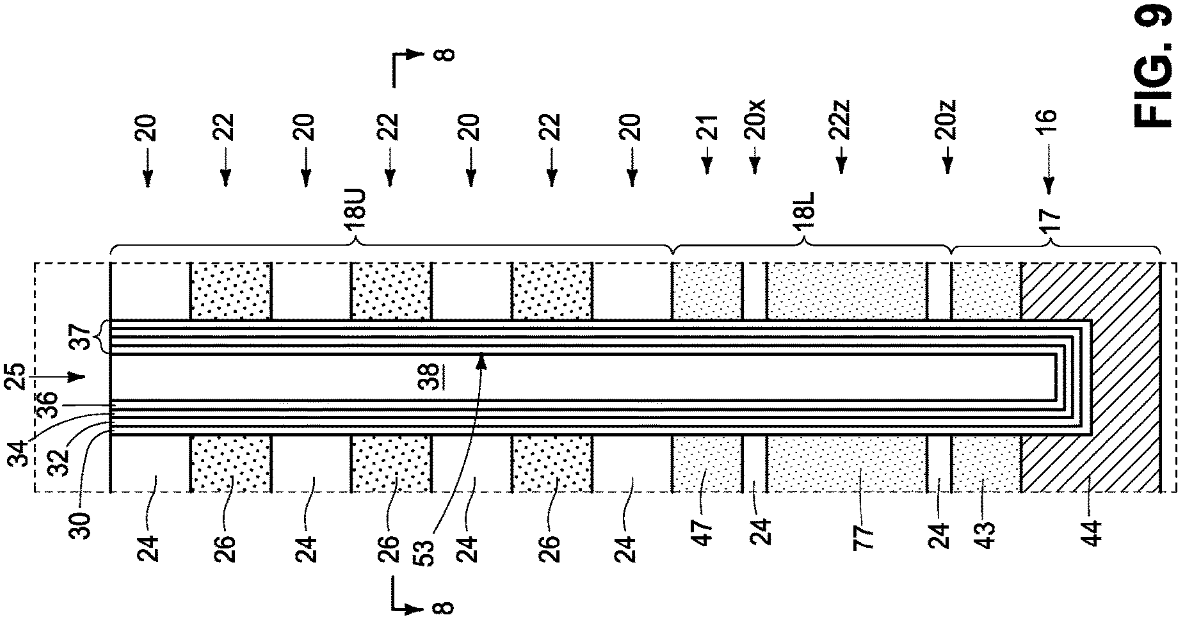
Figure 8:
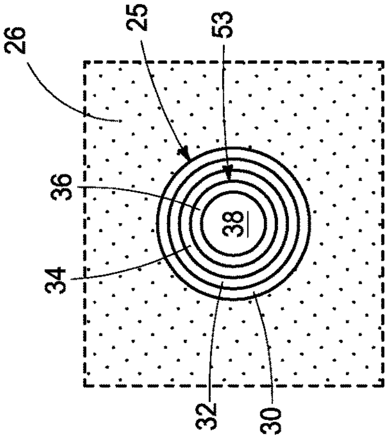

FIG. 5 shows removal of pillars 60 and 64 (not shown) through openings 25 and 76, respectively, thereby extending openings 25 and 76 into lower conductor material 44 of conductor tier 16. In one embodiment, some or all of material 24 may remain (not shown) in extended openings 25 and/or 76. If pillars 60 and/or 64 were not formed, openings 25 and/or 76 could be initially formed into material 44 as shown in FIG. 5.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 6-9 show one embodiment wherein charge-blocking material 30, storage material 32, and charge-passage material 34 have been formed in individual openings 25/76 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25/76 followed by planarizing such back at least to a top surface of stack 18*.

Channel material 36 as an operative channel-material string 53 has also been formed in channel openings 25 elevationally along insulative tiers 20 and conductive tiers 22. Accordingly, operative channel-material strings 53 extend through first tiers 20* and second tiers 22* in upper portion 18U and through upper conductor material 43 into lower conductor material 44. Further, dummy pillars 87 have been formed to extend through first tiers 22* and second tiers 20* in upper portion 18U and through upper conductor material 43 into lower conductor material 44. Accordingly, and in one embodiment, dummy pillars 87 may be of the same materials and construction as operative channel-material strings 53 (as shown) or may be of different one or both of materials and construction (not shown). Materials 30, 32, 34, and 36 are collectively shown as and only designated as material 37 in FIGS. 6 and 7 due to scale. Example channel materials 36 include appropriately-doped crystalline semiconductor material, such as one or more silicon, germanium, and so-called 111/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). A radially-central solid dielectric material 38 (e.g., spin-on-dielectric, silicon dioxide, and/or silicon nitride) is shown in openings 25/76. Alternately, and by way of example only, the radially-central portion within openings 25/76 may include void space(s) (not shown) and/or be devoid of solid material (not shown).

Figure 10:
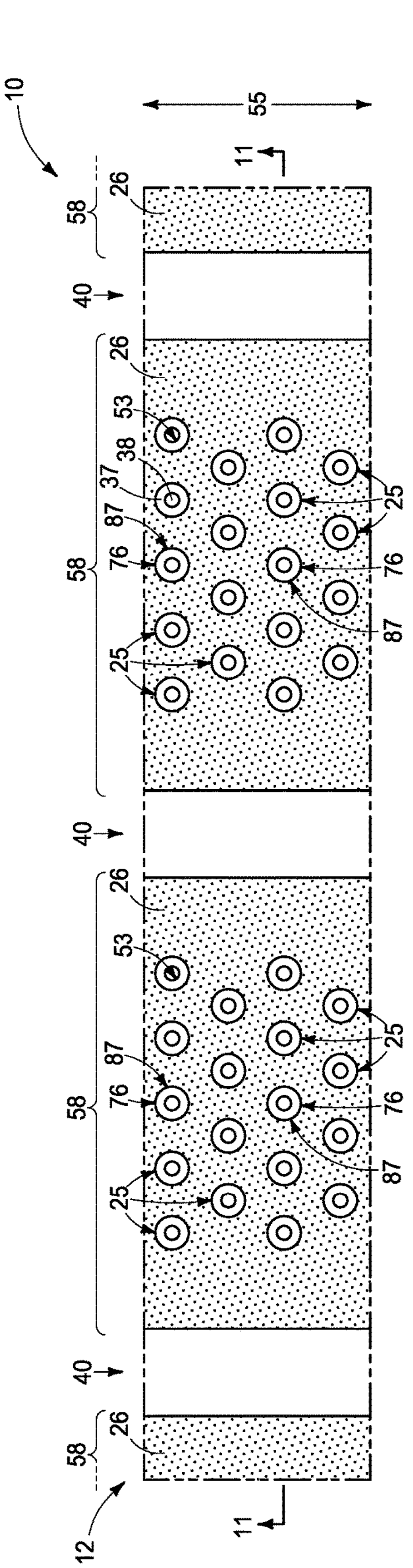
Figure 11:
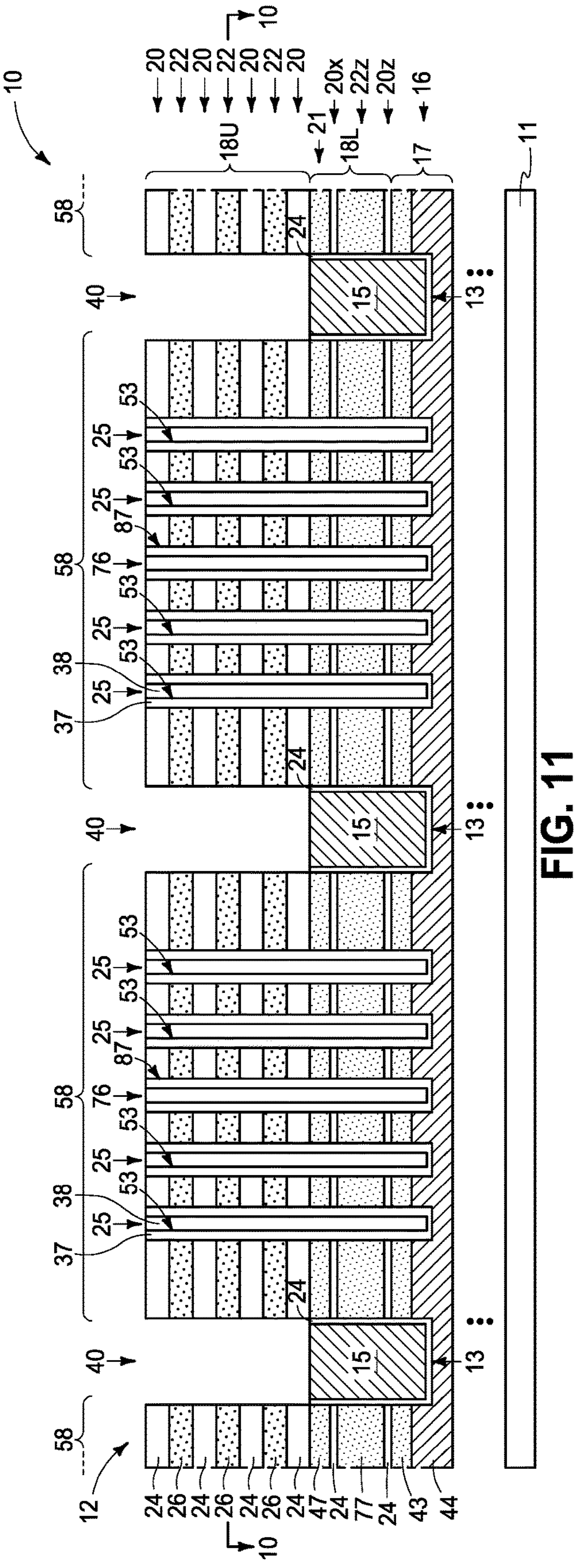

Referring to FIGS. 10 and 11, horizontally-elongated trenches 40 have been formed into stack 18* (e.g., by anisotropic etching) and are individually between immediately-laterally-adjacent memory-block regions 58 and extend to lines 13 there-between (when present).

Figure 12:
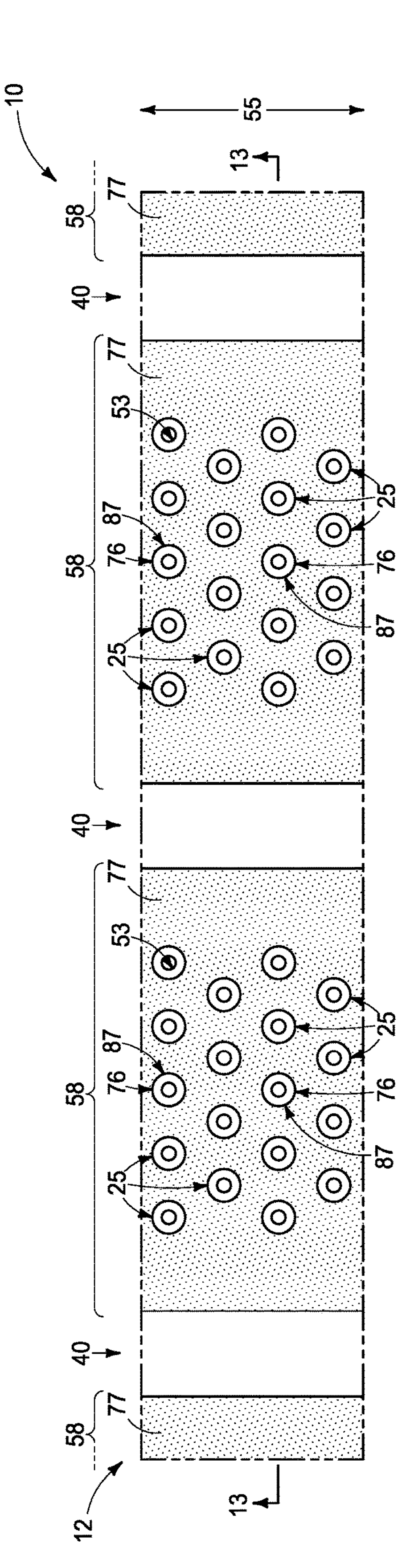
Figure 13:
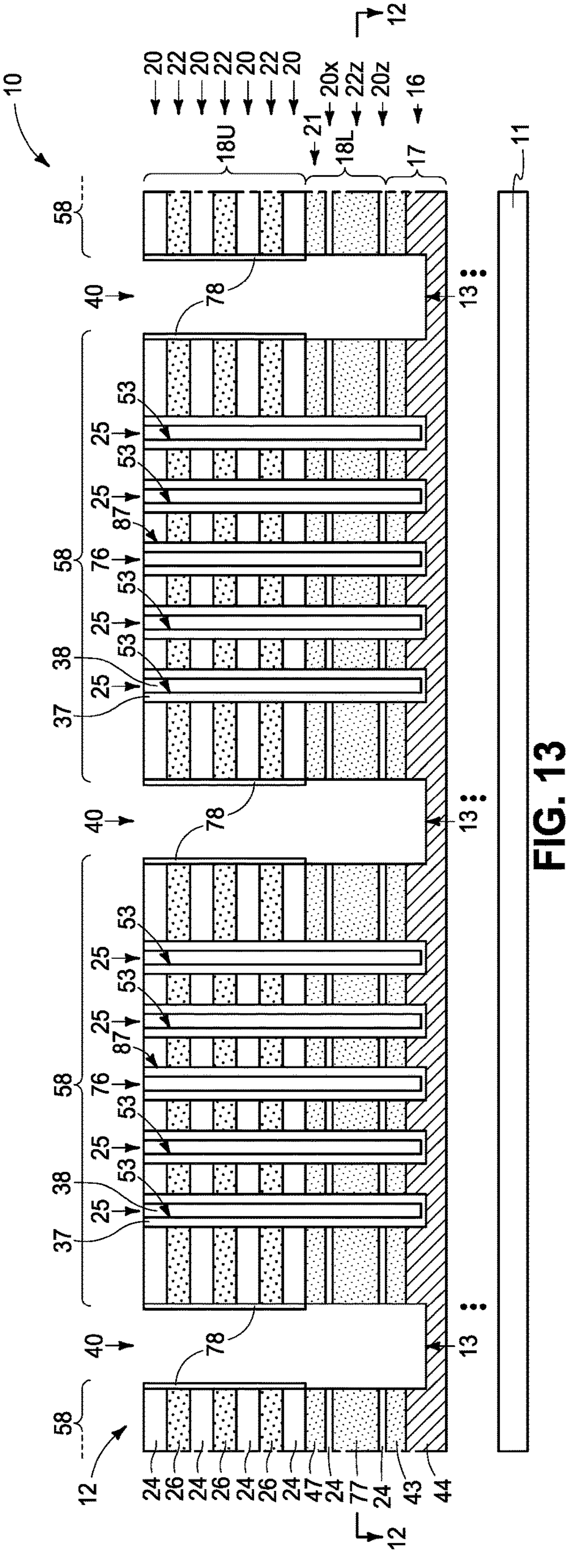

Referring to FIGS. 12 and 13, trenches 40 have been optionally lined with lining material 78 (e.g., hafnium oxide, aluminum oxide, silicon dioxide, silicon nitride, etc., and not shown). Lining material 78 may be partly or wholly sacrificial and ideally is of a composition other than that of materials 24 and 26. After deposition of lining material 78, it may be substantially removed from being over horizontal surfaces, for example by maskless anisotropic spacer-like etching thereof, to expose material 15. Then, material 15 (not shown) and material 24 (not shown) of lines 13 (not shown) have been removed through trenches 40 (e.g., by isotropic etching using a mixture of ammonia and hydrogen peroxide or a mixture of sulfuric acid and hydrogen peroxide if material 15 comprises W, and HF for silicon dioxide).

Figure 14:
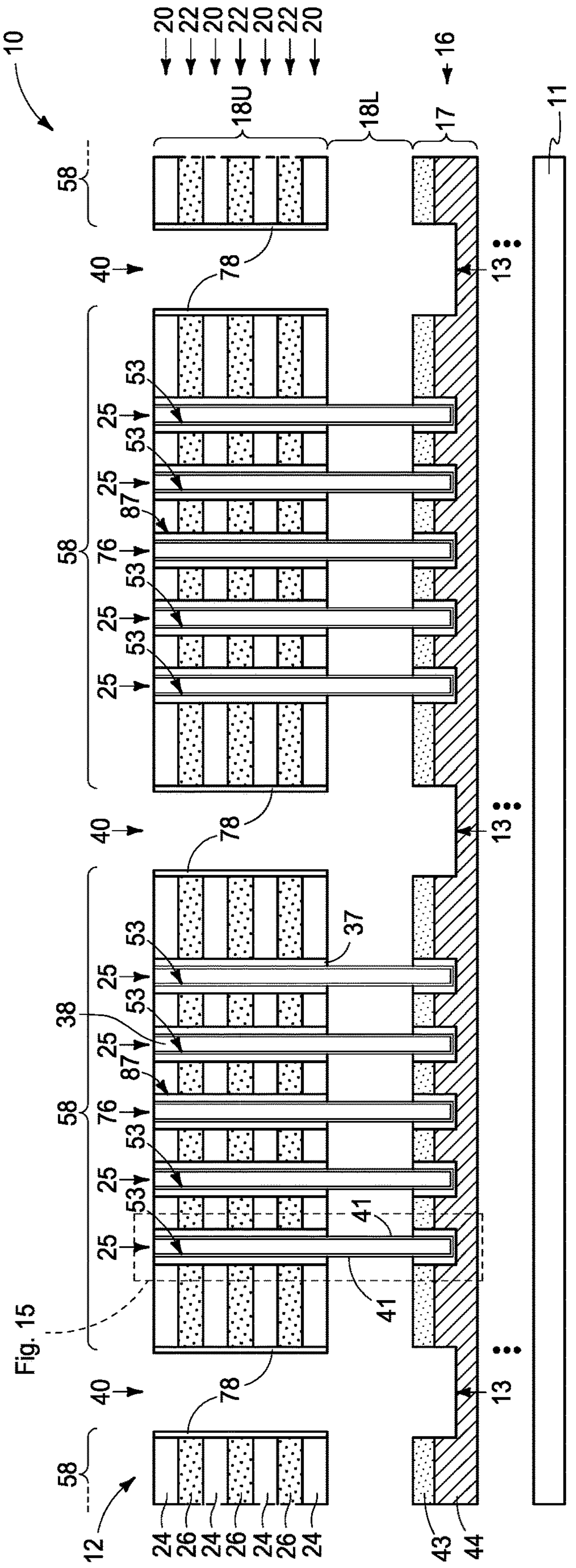
Figure 15:
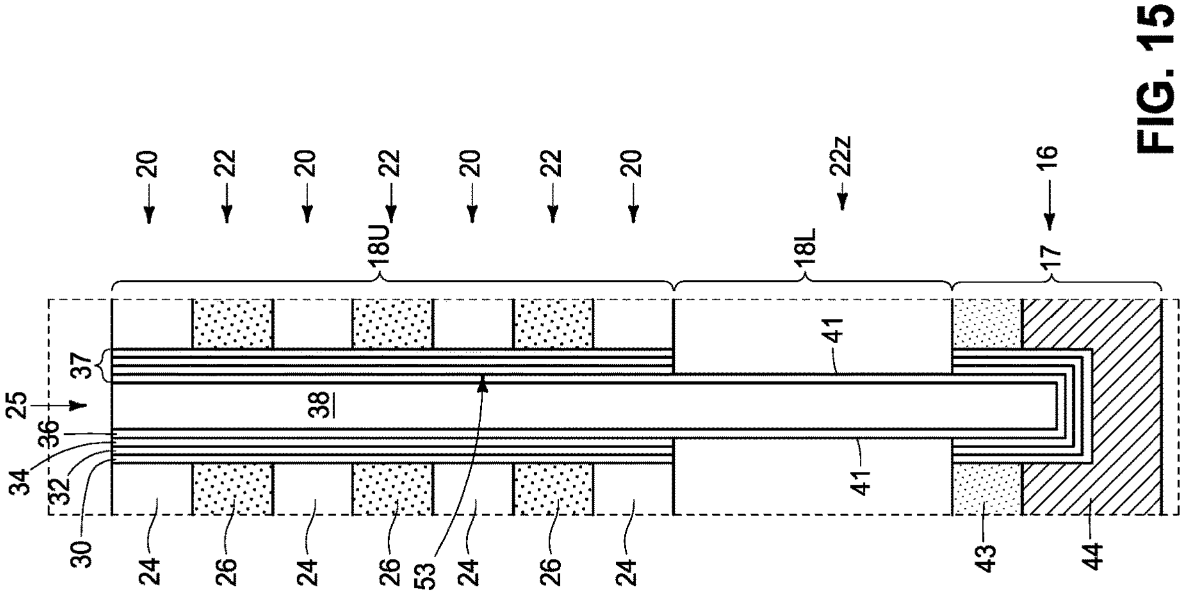

Conductive material is formed in the lowest first tier that directly electrically couples together the channel material of the individual channel-material strings and the conductor material of the conductor tier. For example, and first referring to FIGS. 14 and 15, such show example subsequent processing wherein sacrificial material 77 (not shown) has been isotropically etched from lowest first tier 22*z* through trenches 40 (e.g., using liquid or vapor $H_3PO_4$ as a primary etchant where material 77 is silicon nitride or using tetramethyl ammonium hydroxide [TMAH] where material 77 is polysilicon). Thereafter, in one embodiment, material 30 (e.g., silicon dioxide), material 32 (e.g., silicon nitride), and material 34 (e.g., silicon dioxide or a combination of silicon dioxide and silicon nitride) have been etched in tier 20*z* to expose a sidewall 41 of channel material 36 of channel-material strings 53 in lowest first tier 22*z*. Any of materials 30, 32, and 34 in tier 22*z* may be considered as being sacrificial material therein. As an example, consider an embodiment where liner 78 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 14 and 15. The artisan is capable of selecting other chemistries for etching other different materials where a construction as shown in FIGS. 14 and 15 is desired. Some or all of insulative material (e.g., 24, and not shown in FIGS. 14 and 15) from tiers 20*x* and 20*z* (when present, and not shown as having been removed) may be removed when removing other materials, may be removed separately, or may partially or wholly remain (not shown).

Figure 16:
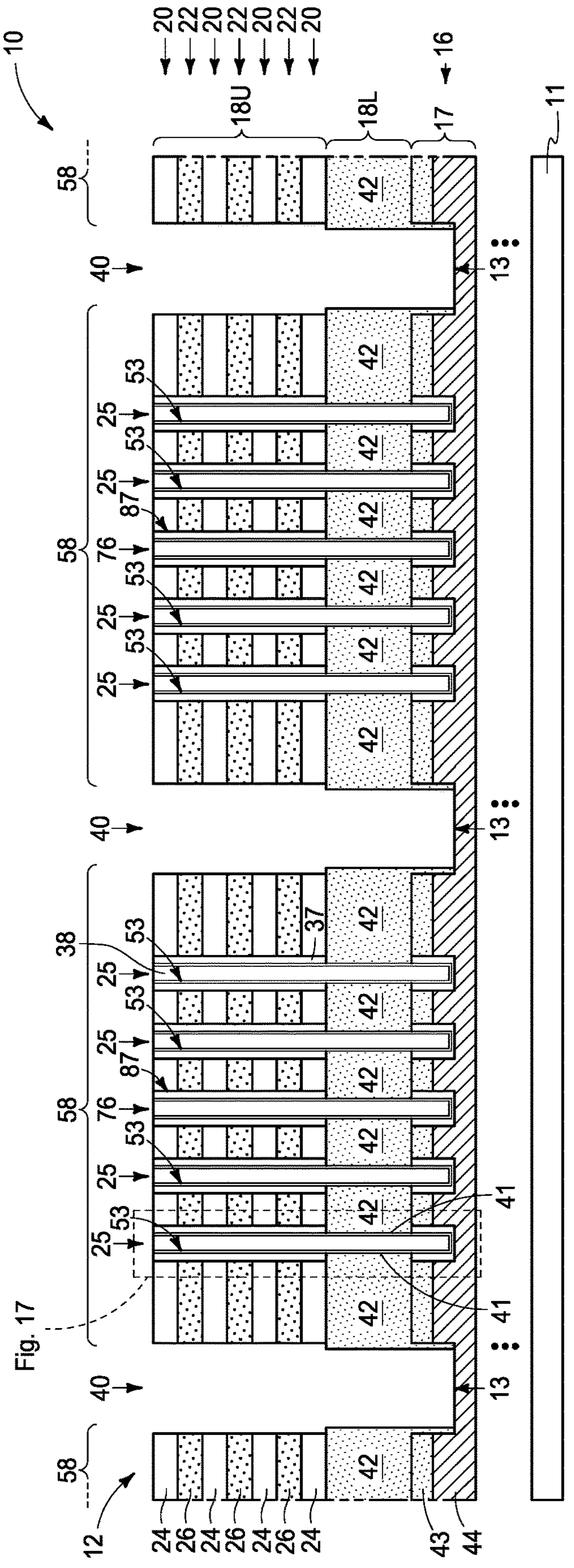
Figure 17:
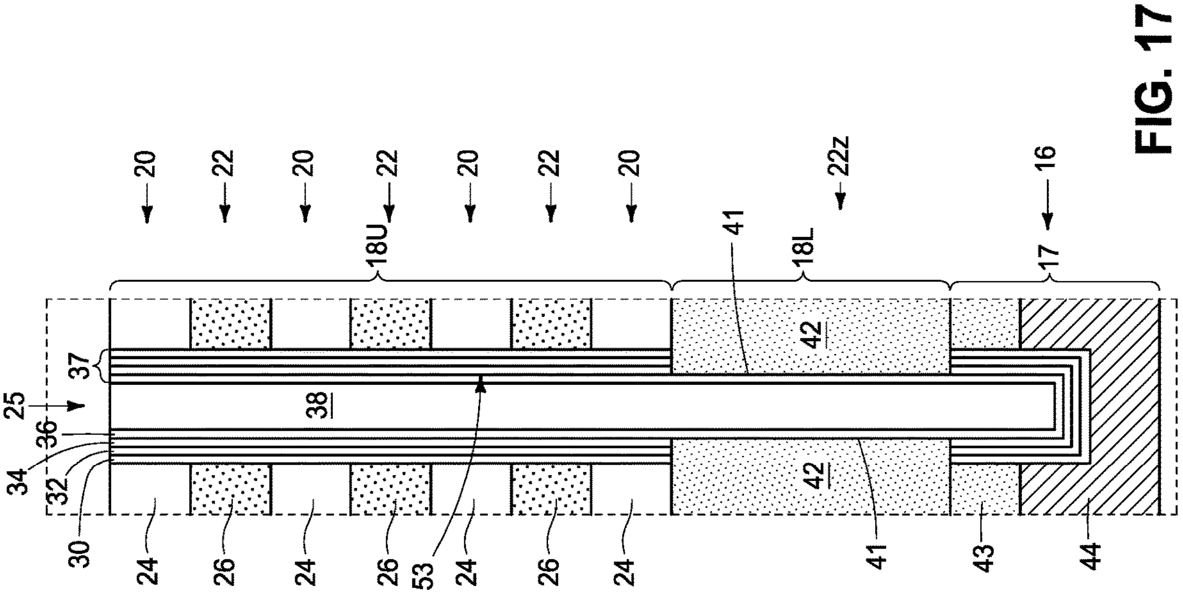
Figure 18:
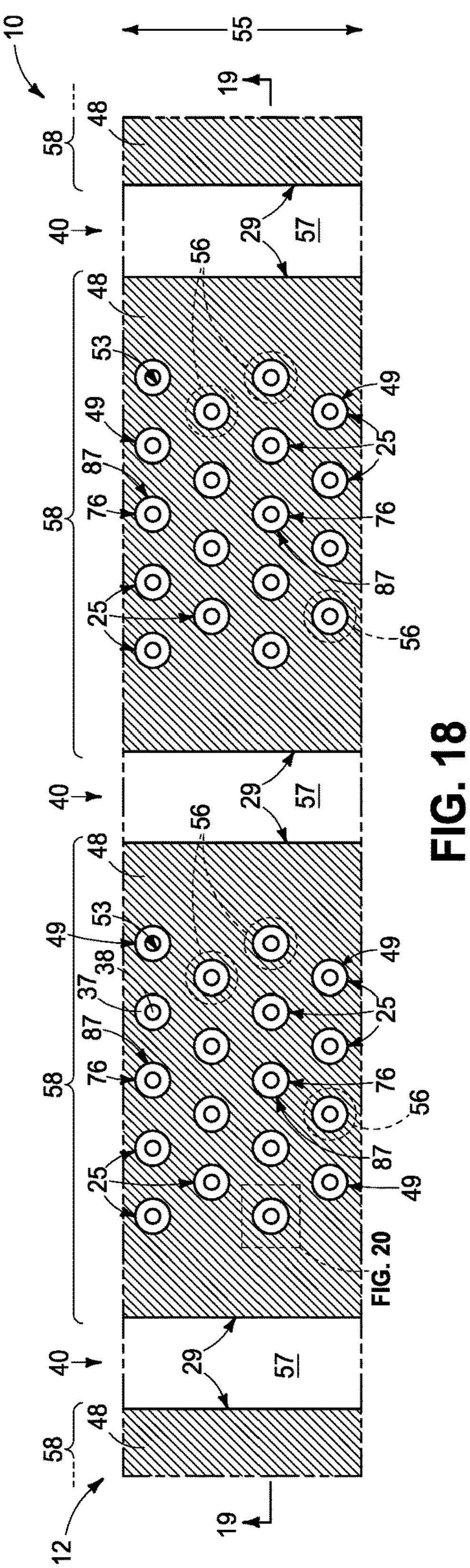
Figure 19:
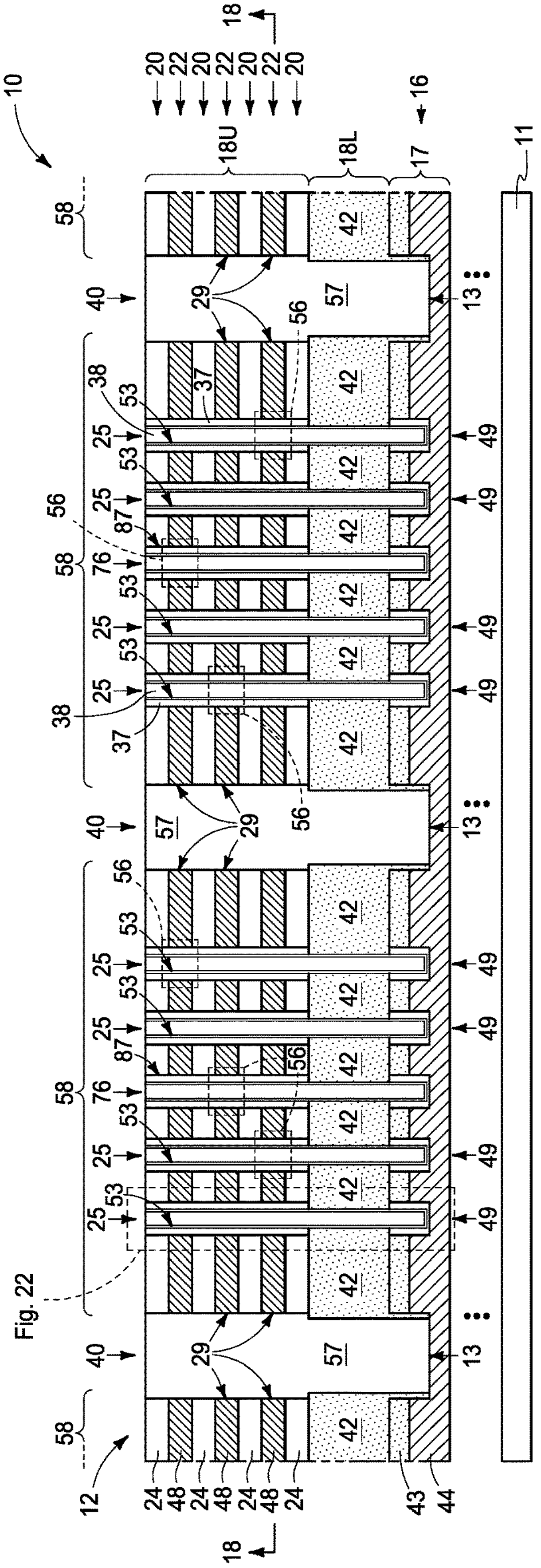
Figure 22:
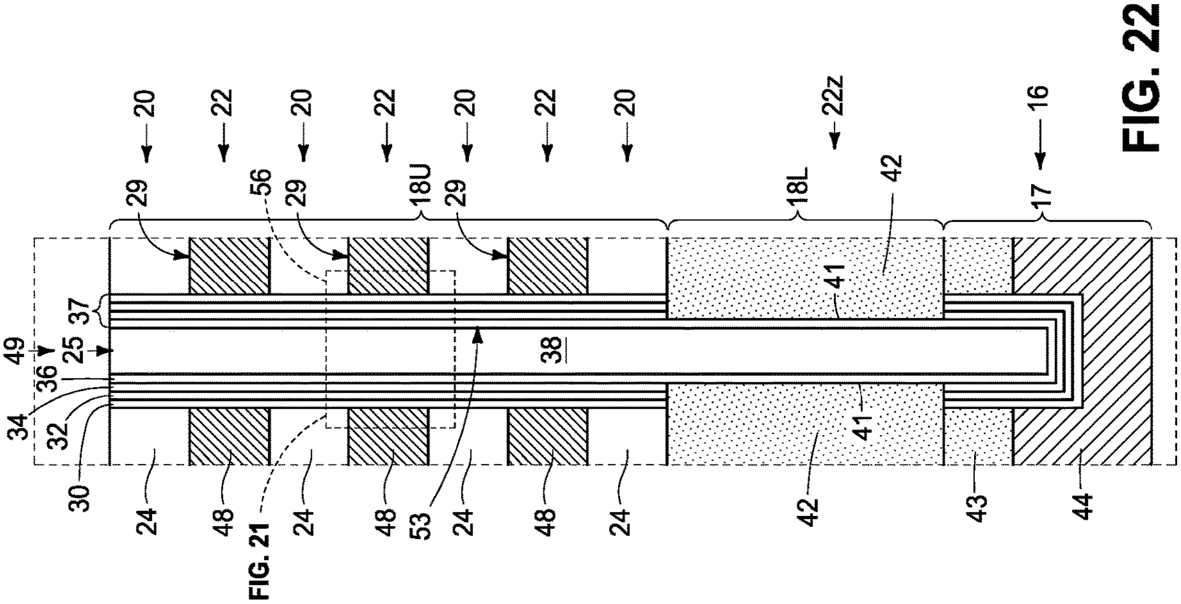
Figure 20:
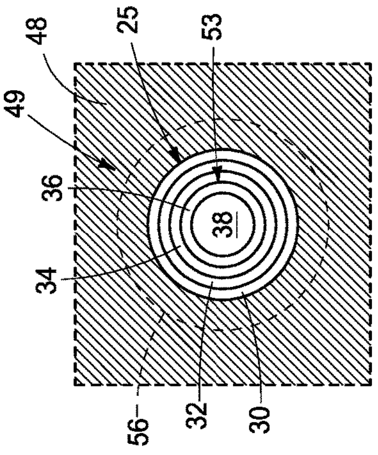
Figure 21:
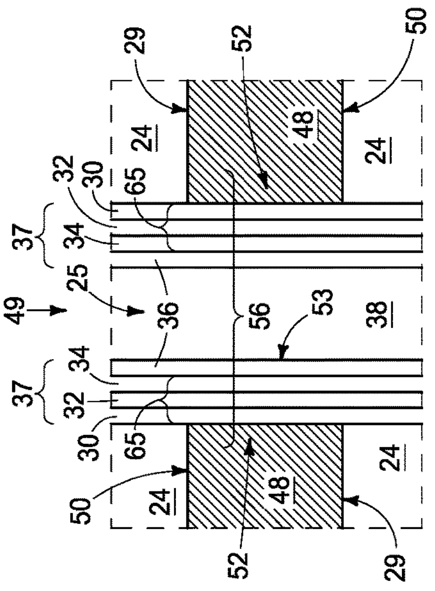

Referring to FIGS. 16 and 17, conductive material 42 (e.g., conductively-doped polysilicon) has been formed in lowest first tier 22*z* and thereby directly electrically couples together channel material 36 of individual operative channel-material strings 53 and conductor material 17 of conductor tier 16. Subsequently, and by way of example, conductive material 42 has been removed from trenches 40 as has sacrificial liner 78 (not shown). Sacrificial liner 78 may be removed before forming conductive material 42 (not shown).

Referring to FIGS. 18-22, material 26 (not shown) of conductive tiers 22* has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 21 and some with dashed outlines in FIGS. 18-20 and 22, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 21) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25/27 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, the lowest surface of channel material 36 of operative channel-material strings 53 is never directly against any of conductor material 17 of conductor tier 16. In one embodiment and as shown, conductive material 42 is directly against sidewalls 41 of channel-material strings 53.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped polysilicon" is polysilicon having from 0 atoms/cm$^3$ to $1\times10^{12}$ atoms/cm$^3$ of atoms of conductivity-increasing impurity. "Doped polysilicon" is polysilicon that has more than $1\times10^{12}$ atoms/cm$^3$ of atoms of conductivity-increasing impurity and "conductively-doped polysilicon" is polysilicon that has at least $1\times10^{18}$ atoms/cm$^3$ of atoms of conductivity-increasing impurity. Intervening material 57 may include through array vias (not shown).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises a conductor tier (e.g., 16) comprising upper conductor material (e.g., 43) directly above and directly electrically coupled to lower conductor material (e.g., 44). The upper and lower conductor materials comprise different compositions relative one another. The array includes laterally-spaced memory blocks (e.g., 58) individually comprising a vertical stack (e.g., 18*) comprising alternating insulative tiers (e.g., 20*) and conductive tiers (e.g., 22*). Channel-material strings (e.g., 53) of memory cells (e.g., 56) extend through the insulative tiers and the conductive tiers and through the upper conductor material into the lower conductor material. Channel material (e.g., 36) of the channel-material strings is directly electrically coupled to the upper and lower conductor materials of the conductor tier. Intervening material (e.g., 57) is laterally-between and longitudinally-along immediately-laterally-adjacent of the memory blocks. Any other attribute(s) or aspect(s) as shown and/or described herein with respect to other embodiments may be used.

In one embodiment, a memory array (e.g., 12) comprises a conductor tier (e.g., 16) comprising upper conductor material (e.g., 43) directly above and directly electrically coupled to lower conductor material (e.g., 44). The upper and lower conductor materials comprise different compositions relative one another. The array includes laterally-spaced memory blocks (e.g., 58) individually comprising a vertical stack (e.g., 18*) comprising alternating insulative tiers (e.g., 20*) and conductive tiers (e.g., 22*). Channel-material strings (e.g., 53) of memory cells (e.g., 56) extend through the insulative tiers and the conductive tiers. Channel material (e.g., 36) of the channel-material strings is directly electrically coupled to the upper and lower conductor materials of the conductor tier. Dummy pillars (e.g., 87) extend through the insulative tiers and the conductive tiers and through the upper conductor material into the lower conductor material. Intervening material (e.g., 57) is laterally-between and longitudinally-along immediately-laterally-adjacent of the memory blocks. In one embodiment, the channel-material strings extend through the upper conductor material into the lower conductor material.

Figure 23:
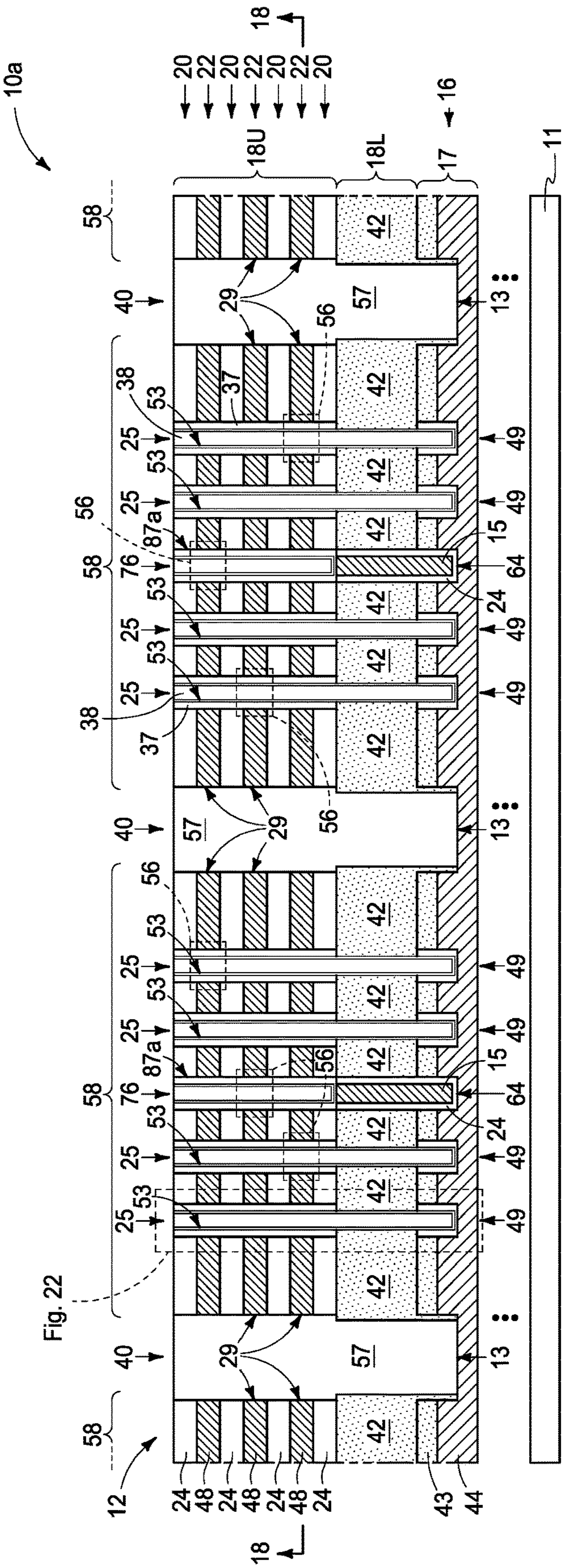

In one embodiment, the dummy pillars and the channel-material strings are of the same composition and structure in the conductive tiers where the memory cells are located. In one such embodiment, a lowest portion of individual of the dummy pillars is of different composition and structure from that of individual of the channel-material strings, and in one such embodiment the different composition comprises polysilicon. For example, and by way of example, only, FIG. 23 shows an alternate embodiment construction 10*a*. Like numerals from the above-described embodiments have been used where appropriate, with some construction differences being indicated with the suffix "a" or with different numerals. Dummy pillars 87*a* individually have lowest portions the same as that of pillars 64 of FIG. 2, and in one embodiment comprise polysilicon (e.g., material 15). Such a structure may result, by way of example only, using a method as described above but wherein openings 76 are masked while removing sacrificial pillars 60 from openings 25.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there—from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, “thickness” by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, “different composition” only requires those portions of two stated materials or regions that may be directly against one another to be chemically and/or physically different, for example if such materials or regions are not homogenous. If the two stated materials or regions are not directly against one another, “different composition” only requires that those portions of the two stated materials or regions that are closest to one another be chemically and/or physically different if such materials or regions are not homogenous. In this document, a material, region, or structure is “directly against” another when there is at least some physical touching contact of the stated materials, regions, or structures relative one another. In contrast, “over”, “on”, “adjacent”, “along”, and “against” not preceded by “directly” encompass “directly against” as well as construction where intervening material(s), region (s), or structure(s) result(s) in no physical touching contact of the stated materials, regions, or structures relative one another.

Herein, regions-materials-components are “electrically coupled” relative one another if in normal operation electric current is cap able of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being “directly electrically coupled”, no intervening electronic component (e.g., no diode, transistor, resistor, transducer, switch, fuse, etc.) is between the directly electrically coupled regions-materials-components.

Any use of “row” and “column” in this document is for convenience in distinguishing one series or orientation of features from another series or orientation of features and along which components have been or may be formed. “Row” and “column” are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. “Metal material” is any one or combination of an elemental metal, any mixture or alloy of two or more elemental metals, and any one or more conductive metal compound(s).

Herein, any use of “selective” as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of “or” herein encompasses either and both.

CONCLUSION

In some embodiments, a method used in forming a memory array comprising strings of memory cells comprises forming a conductor tier comprising upper conductor material directly above and directly electrically coupled to lower conductor material. The upper and lower conductor materials comprise different compositions relative one another. A stack is formed comprising vertically-alternating first tiers and second tiers above the conductor tier. The stack comprises laterally-spaced memory-block regions. Material of the first tiers is of different composition from material of the second tiers. Channel-material strings are formed that extend through the first tiers and the second tiers and through the upper conductor material into the lower conductor material. Intervening material is formed laterally-between and longitudinally-along immediately-laterally-adjacent of the memory-block regions.

In some embodiments, a method used in forming a memory array comprising strings of memory cells comprises forming a conductor tier comprising upper conductor material directly above and directly electrically coupled to lower conductor material. The upper and lower conductor materials comprise different compositions relative one another. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises sacrificial-material. A lowest of the second tiers is below the lowest first tier. The vertically-alternating first tiers and second tiers of an upper portion of the stack are formed above the lower portion. Channel-material strings are formed that extend through the first tiers and the second tiers and through the upper conductor material into the lower conductor material.

Horizontally-elongated trenches are formed into the stack that are individually between immediately-laterally-adjacent of the memory-block regions and extend to the lowest first tier. The sacrificial material is isotropically etched from the lowest first tier through the trenches. The lowest second tier is removed after the isotropically etching. After removing the lowest second tier, conductive material is formed in the lowest first tier that directly electrically couples together the channel material of the individual channel-material strings and the conductor tier. Intervening material is formed laterally-between and longitudinally-along immediately-laterally-adjacent of the memory-block regions.

In some embodiments, a memory array comprises a conductor tier comprising upper conductor material directly above and directly electrically coupled to lower conductor material. The upper and lower conductor materials comprise different compositions relative one another. Laterally-spaced memory blocks individually comprising a vertical stack comprise alternating insulative tiers and conductive tiers. Channel-material strings of memory cells extend through the insulative tiers and the conductive tiers and through the upper conductor material into the lower conductor material. The channel material of the channel-material strings is directly electrically coupled to the upper and lower conductor materials of the conductor tier. Intervening material is laterally-between and longitudinally-along immediately-laterally-adjacent of the memory blocks.

In some embodiments, a memory array comprises a conductor tier comprising upper conductor material directly above and directly electrically coupled to lower conductor material. The upper and lower conductor materials comprise different compositions relative one another. Laterally-spaced memory blocks individually comprising a vertical stack comprise alternating insulative tiers and conductive tiers. Channel-material strings of memory cells extend through the insulative tiers and the conductive tiers. The channel material of the channel-material strings is directly electrically coupled to the upper and lower conductor materials of the conductor tier. Dummy pillars extend through the insulative tiers and the conductive tiers and through the upper conductor material into the lower conductor material. Intervening material is laterally-between and longitudinally-along immediately-laterally-adjacent of the memory blocks.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising:

a conductor tier comprising upper conductor material directly above and directly electrically coupled to lower conductor material, the upper and lower conductor materials comprising different compositions relative one another;

laterally-spaced memory blocks individually comprising a vertical stack comprising alternating insulative tiers and conductive tiers, channel-material strings of memory cells extending through the insulative tiers and the conductive tiers and through the upper conductor material into the lower conductor material, the channel material of the channel-material strings being directly electrically coupled to the upper and lower conductor materials of the conductor tier; and intervening material laterally-between and longitudinally-along immediately-laterally-adjacent of the memory blocks.

2. The memory array of claim 1 wherein the upper conductor material comprises conductively-doped semiconductive material.

3. The memory array of claim 2 wherein the conductively-doped semiconductive material comprises conductively-doped polysilicon.

4. The memory array of claim 1 wherein the lower conductor material comprises metal material.

5. The memory array of claim 4 wherein the metal material comprises a metal silicide.

6. The memory array of claim 5 wherein the upper conductor material comprises conductively-doped semiconductive material and the lower conductor material comprises metal material.

7. The memory array of claim 6 wherein the upper conductor material comprises conductively-doped polysilicon and the lower conductor material comprises a metal silicide.

8. The memory array of claim 4 wherein the metal material of the lower conductor material comprises tungsten silicide.

9. A memory array comprising:

a conductor tier comprising upper conductor material directly above and directly electrically coupled to lower conductor material, the upper and lower conductor materials comprising different compositions relative one another;

laterally-spaced memory blocks individually comprising a vertical stack comprising alternating insulative tiers and conductive tiers, channel-material strings of memory cells extending through the insulative tiers and the conductive tiers, the channel material of the channel-material strings being directly electrically coupled to the upper and lower conductor materials of the conductor tier;

dummy pillars extending through the insulative tiers and the conductive tiers and through the upper conductor material into the lower conductor material; and intervening material laterally-between and longitudinally-along immediately-laterally-adjacent of the memory blocks.

10. The memory array of claim 9 wherein the channel-material strings extend through the upper conductor material into the lower conductor material.

11. The memory array of claim 9 wherein the dummy pillars and the channel-material strings are of the same composition and structure in the conductive tiers where the memory cells are located.

12. The memory array of claim 11 wherein a lowest portion of individual of the dummy pillars is of different composition and structure from that of individual of the channel-material strings.

13. The memory array of claim 12 wherein the different composition comprises polysilicon.

* * * * *